United States Patent
Hatakeyama et al.

[11] Patent Number: 6,132,529
[45] Date of Patent: Oct. 17, 2000

[54] LEADFRAME MADE OF A HIGH-STRENGTH, HIGH-ELECTROCONDUCTIVITY COPPER ALLOY

[75] Inventors: Koichi Hatakeyama; Akira Sugawara; Toshihiro Kanzaki, all of Tokyo, Japan

[73] Assignee: Dowa Mining Co., Ltd., Tokyo, Japan

[21] Appl. No.: 08/827,664

[22] Filed: Apr. 10, 1997

Related U.S. Application Data

[62] Division of application No. 08/662,695, Jun. 13, 1996, Pat. No. 5,814,168.

[30] Foreign Application Priority Data

Oct. 9, 1995 [JP] Japan ................................. 7-287826

[51] Int. Cl.$^7$ ................................................. C22F 1/08
[52] U.S. Cl. ........................... 148/435; 148/433; 148/434
[58] Field of Search ...................... 148/435, 433, 148/434; 420/487

[56] References Cited

U.S. PATENT DOCUMENTS

| | | | |
|---|---|---|---|
| 3,522,112 | 7/1970 | McLain | 148/681 |
| 4,305,762 | 12/1981 | Cason et al. | 148/32 |
| 5,147,469 | 9/1992 | Kanzaki et al. | 148/684 |

FOREIGN PATENT DOCUMENTS

| | | |
|---|---|---|
| 55-14132 | 4/1980 | Japan . |
| 55-14134 | 4/1980 | Japan . |
| 58-53057 | 11/1983 | Japan . |
| 59-009141 | 1/1984 | Japan . |
| 61-48545 | 3/1986 | Japan . |
| 61-194160 | 8/1986 | Japan . |
| 62-99430 | 5/1987 | Japan . |
| 62-227052 | 10/1987 | Japan . |
| 62-267456 | 11/1987 | Japan . |
| 63-4885 | 2/1988 | Japan . |
| 63-111151 | 5/1988 | Japan . |
| 63-250444 | 10/1988 | Japan . |
| 64-8067 | 2/1989 | Japan . |
| 2-43350 | 2/1990 | Japan . |
| 3-2341 | 1/1991 | Japan . |
| 3-14901 | 2/1991 | Japan . |
| 3031437 | 2/1991 | Japan . |
| 3199355 | 8/1991 | Japan . |
| 3-285053 | 12/1991 | Japan . |
| 3-294459 | 12/1991 | Japan . |
| 4-18016 | 3/1992 | Japan . |
| 4-272161 | 9/1992 | Japan . |
| 5-34409 | 5/1993 | Japan . |
| 6-73474 | 3/1994 | Japan . |
| 6-35633 | 5/1994 | Japan . |

*Primary Examiner*—Sikyin Ip
*Attorney, Agent, or Firm*—Frishauf, Holtz, Goodman, Langer & Chick, P.C.

[57] ABSTRACT

A leadframe of a single frame structure for supporting leads on IC chips. The leadframe is made of a high-strength, high-electroconductivity copper alloy. The copper alloy is produced by preparing an ingot of a copper alloy of 0.05–0.40 wt. % Fe, 0.05–0.40 wt. % Ni, 0.01–0.30 wt. % P, and optionally a total of 0.03–0.50 wt. % of either Sn or Zn or both and a total of 0.05–0.50 wt. % of at least one element of Ag, Co, B, Mn, Cr, Si, Ti and Zr, with the balance being Cu and incidental impurities, heating the ingot to 800 to 950° C. and hot working the ingot to a reduction ratio of 50% or more, quenching the hot worked material from 600° C. or above down to 300° C. or below at a cooling rate of at least 1° C./seconds, heat treating the quenched material at 380 to 520° C. for 60–600 minutes without cold working, and subsequently carrying out cold working and heat treating at 450° C. or below, whereby an Fe—Ni—P system intermetallic compound is precipitated in the Cu matrix as uniform and fine grains not larger than 50 nm.

19 Claims, 1 Drawing Sheet

LEADFRAME MADE OF A HIGH-STRENGTH, HIGH-ELECTROCONDUCTIVITY COPPER ALLOY

This is a division of application Ser. No. 08/662,695 filed Jun. 13, 1996, now U.S. Pat. No. 5,814,168.

BACKGROUND OF THE INVENTION

This invention relates to a process for producing high-strength, high-electroconductivity copper-base alloys suitable for use as materials to make electric and electronic components such as leadframes.

With the recent development of the electronics industry, the use of materials to make electric and electronic components such as leadframes is growing and it is required that they have more reliable characteristics whereas they can be manufactured at a lower cost.

The term "leadframe" as used herein may be defined as "a single frame structure that supports the leads on IC chips during or after the fabrication process". Leadframes are required to have the following characteristics.

(1) Good Thermal and Electrical Conductivities:

One of the primary functions of leadframes is to prevent the deterioration of Si chips by diffusing the heat generated on the chips. To increase the efficiency of heat diffusion, the leadframes must have good thermal conductivity and, what is more, they are required to have good electrical conductivity in order to reduce heat generation in the lead portions. Since a linear relationship is generally recognized between thermal and electrical conductivities, the measurement of electrical conductivity will suffice for the evaluation of thermal conductivity.

(2) High Strength:

Leadframes, and outer leads in particular, are required to have sufficient strength to support the IC chips moldings including during and after the fabrication process. The criteria for evaluation include high tensile strength, high yield point and sufficient stiffness.

(3) Sufficient Heat Resistance:

Leadframes are expected to be subject to a certain degree of heat during or after the fabrication process and, therefore, they must be sufficiently heat resistant to ensure against deterioration in strength under thermal loads. In practice, however, unduly high heat-resisting temperatures are expected to cause economic disadvantages such as the need to employ high annealing temperatures during the preparation of raw materials. Therefore, leadframes will suffice for practical purposes if they do not soften upon heating at 350° C. for a few minutes.

(4) Amenability to Bending Work:

In almost all cases, leadframes are subjected to bending in the lead portions and hence are required to have amenability to bending work. The methods for evaluation include V and W bending, as well as cyclic bend test.

(5) Good Platability and Solderability:

Leadframes are often provided with a Ag/Au plate on the inner leads and with a solder plates on the outer leads. Hence, they need satisfy good platability and solderability requirements, as well as the requirement that the applied plate and solder be resistant to weathering.

(6) Low Cost:

While leadframes are required to possess these characteristics, no single materials have heretofore been available that satisfy all of these requirements and that are yet inexpensive. In addition, the reliability requirement of semiconductors has recently become more rigorous than before and the use of surface-mounting type (SMT) devices which can be fabricated in smaller sizes has also increased. As a result, the ability to withstand the heat of solder without delamination has become a by far more important characteristic than it has been in the past. Leadframes are mounted on printed-wiring boards by soldering and in an operating environment the temperature of the soldered part will rise to a maximum of 120–150° C. due both to the external temperature and to the heat generation during the application of an electric current. If the semiconductor device is exposed to such environment for a prolonged time, the solder layer will separate from the leadframe and the device is no longer operational. Hence, in the case where high device reliability is required and particularly with surface-mounting types such as QFP (quad flat L-leaded package) and PLCC (plastic leaded chip carrier) which are mounted by area contact rather than by insertion into through-holes in the printed-wiring board, the ability to withstand the heat of solder without delamination is an extremely important design factor.

SUMMARY OF THE INVENTION

Thus, the known copper-base alloys are experiencing increasing difficulty in meeting the needs of certain uses and it has been desired to develop copper-base alloys that can maintain high reliability when used as materials to make electric and electronic components.

An object, therefore, of the present invention is to develop copper-base alloys that are produced by a process including heat treatments to be performed under specified conditions and which hence exhibit superiority in various factors such as hardness, tensile strength, electric conductivity, amenability to bending work and adhesion to plates.

The present inventors conducted intensive studies in order to attain the stated object of the invention and found that the desired copper-base alloys could be produced by heat treating Fe—Ni—P containing, copper-base alloys under specified conditions such that Fe—Ni—P system intermetallic compounds would be precipitated as uniform fine particles not larger than 50 nm (nanometers). The process of the present invention has been accomplished on the basis of this finding.

According to a first aspect of the invention, there is provided a process for producing a high-strength, high-electroconductivity copper-base alloy that comprises the steps of preparing an ingot of a copper-base alloy essentially consisting 0.05–0.40 wt % Fe, 0.05–0.40 wt % Ni, 0.01–0.30 wt % P and the balance being Cu and incidental impurities, heating the ingot to a temperature of 800–950° C. and hot working it by a reduction ratio of 50% or more, quenching the hot worked material from 600° C. or above down to 300° C. or below at a cooling rate of at least 1° C./sec, heat treating the quenched material at a temperature of 380–520° C. for 60–600 min without performing cold working, and subsequently performing cold working and a heat treatment at 450° C. or below.

According to a second aspect of the invention, there is provided a process for producing a high-strength, high-electroconductivity copper-base alloy that comprises the steps of preparing an ingot of a copper-base alloy essentially consisting 0.05–0.40 wt % Fe, 0.05–0.40 wt % Ni, 0.01–0.30 wt % P as well as a total of 0.03–0.50 wt % of either Sn or Zn or both, and the balance being Cu and incidental impurities, heating the ingot to a temperature of 800–950° C. and hot working it by a reduction ratio of 50% or more, quenching the hot worked material from 600° C. or above down to 300° C. or below at a cooling rate of at least 1° C./sec, heat treating the quenched material at a temperature of 380–520° C. for 60–600 min without performing cold working, and subsequently performing cold working and a heat treatment at 450° C. or below.

According to a third aspect of the invention, there is provided a process for producing a high-strength, high-electroconductivity copper-base alloy that comprises the steps of preparing an ingot of a copper-alloy essentially consisting 0.05–0.40 wt % Fe, 0.05–0.40 wt % Ni, 0.01–0.30 wt % P, as well as a total of 0.03–0.50 wt % of either Sn or Zn or both and a total of 0.05–0.50 wt % of at least one element selected from the group consisting of Ag, Co, B, Mn, Cr, Si, Ti and Zr, with the balance being Cu and incidental impurities, heating the ingot to a temperature of 800–950° C. and hot working it by a reduction ratio of 50% or more, quenching the hot worked material from 600° C. or above down to 300° C. or below at a cooling rate of at least 1° C./sec, heat treating the quenched material at a temperature of 380–520° C. for 60–600 min without performing cold working, and subsequently performing cold working and a heat treatment at 450° C. or below.

According to a fourth aspect of the invention, there is provided a process for producing a high-strength, high-electroconductivity copper-base alloy which comprises the steps of preparing an ingot of a copper-base alloy consisting 0.05–0.40 wt % Fe, 0.05–0.40 wt % Ni, 0.01–0.30 wt % P and optionally a total of 0.03–0.50 wt % of either Sn or Zn or both and a total of 0.05–0.50 wt % of at least one element selected from the group consisting of Ag, Co, B, Mn, Cr, Si, Ti and Zr, with the balance being Cu and incidental impurities, heating the ingot to a temperature of 800–950° C. and hot working it by a reduction ratio of 50% or more, quenching the hot worked material from 600° C. or above down to 300° C. or below at a cooling rate of at least 1° C./sec, heat treating the quenched material at a temperature of 380–520° C. for 60–600 min without performing cold working, and subsequently performing cold working and a heat treatment at 450° C. or below, whereby an Fe—Ni—P system intermetallic compound is precipitated in the Cu matrix as uniform and fine grains not larger than 50 nm (nanometers).

Thus, the invention provides copper-base alloys that possess the already stated characteristics required of materials to make electric and electronic components typified by leadframes, i.e., high strength, elasticity and thermal (and electrical) conductivity, as well as good heat resistance, high amenability to bending work and the ability to withstand the heat of solder without delamination. Stated more specifically, the invention provides a process for producing high-strength, high-electroconductivity copper-base alloys that comprises the steps of preparing an ingot of a copper-base alloy essentially consisting of 0.05–0.40 wt % Fe, 0.05–0.40 wt % Ni, 0.01–0.30 wt % P, and optionally a total of 0.03–0.50 wt % of either Sn or Zn or both and a total of 0.05–0.50 wt % of at least one element selected from the group consisting of Ag, Co, B, Mn, Cr, Si, Ti and Zr, with the balance being Cu and incidental impurities, heating the ingot to a temperature of 800–950° C. and hot working it by a reduction ratio of 50% or more, quenching the hot worked material from 600° C. or above down to 300° C. or below at a cooling rate of at least 1° C./sec, heat treating the quenched material at a temperature of 380–520° C. for 60–600 min without performing cold working, and subsequently performing cold working and a heat treatment either once or as many times as are required to finish the material to a final size, whereby an Fe—Ni—P system intermetallic compound is precipitated in the Cu matrix as uniform and fine grains not larger than 50 nm (nanometers).

The process of the invention is basically characterized in that Fe, Ni and P are added in appropriate amounts to the copper-base alloy, which is then subjected to appropriate working and heat treatments such that an Fe—Ni—P system intermetallic compound is uniformly precipitated in the Cu matrix as fine grains not larger than 50 nm, thereby allowing the stated characteristics to be exhibited which are advantageous for materials of a type to make electric and electronic components such as leadframes.

DETAILED DESCRIPTION OF THE INVENTION

Figure 1:
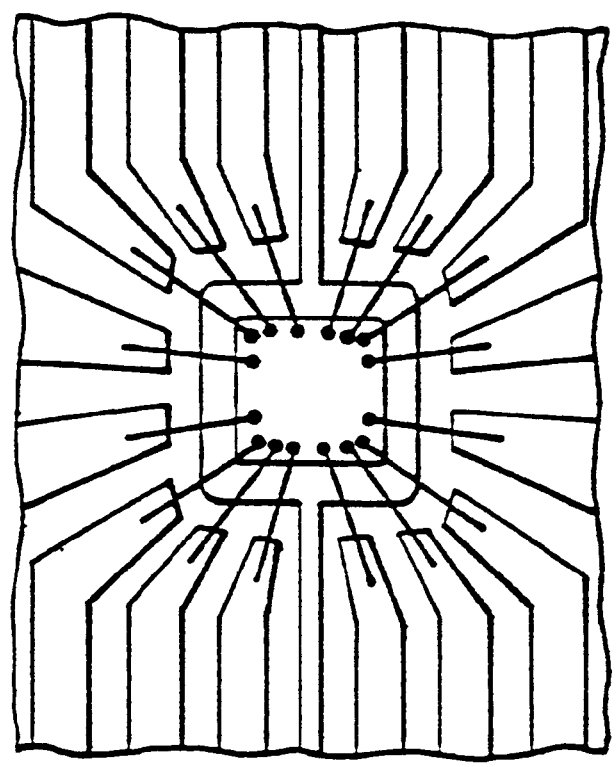
FIG. 1 shows a leadframe structure with an IC chip supported thereon.

We now describe the criticality of the compositional ranges of the copper-base alloys of the invention, as well as the reasons why working and heat treatments are to be performed under the conditions set forth above.

(1) Fe:

Iron (Fe) dissolves in the Cu matrix to provide better strength and elasticity; in addition, Fe forms compounds with Ni and P, which are dispersed and precipitated to provide better thermal (and electrical) conductivity and achieve further improvements in strength and elasticity. Iron is also an element that contributes to an improvement in heat resistance.

If the Fe content is less than 0.05 wt %, the stated effects are not fully attained; if the Fe content exceeds 0.40 wt %, there occurs a marked drop in thermal (and electrical) conductivity even in the presence of P and economic disadvantages will also occur as exemplified by the need to employ unduly high annealing temperatures in the manufacturing process.

Hence, the Fe content is specified to lie between 0.05 wt % and 0.40 wt %. A preferred range for the Fe content is from 0.10 wt % to 0.30 wt %.

(2) Ni:

Nickel (Ni) dissolves in the Cu matrix to provide better strength and elasticity; in addition, Ni forms compounds with Fe and P, which are dispersed and precipitated to provide better thermal (and electrical) conductivity and achieve further improvements in strength and elasticity. Nickel is also an element that contributes to an improvement in heat and corrosion resistance.

If the Ni content is less than 0.05 wt %, the stated effects are not fully achieved; if the Ni content exceeds 0.40 wt %, there occurs a marked drop in thermal (and electrical) conductivity even in the presence of P and economic disadvantages will also occur as exemplified by the need to employ unduly high annealing temperatures in the manufacturing process.

Hence, the Ni content is specified to lie between 0.05 wt % and 0.40 wt %. A preferred range for the Ni content is from 0.10 wt % to 0.30 wt %.

(3) P:

Phosphorus (P) not only works as a deoxidizer of the melt but also forms compounds with Fe and Ni, which are dispersed and precipitated to provide better thermal (and electrical) conductivity and achieve an improvement in strength and elasticity.

If the P content is less than 0.01 wt %, the stated effects are not fully achieved; if the P content exceeds 0.30 wt %, there occurs a marked drop in thermal (and electrical) conductivity even in the presence of Fe and Ni and the hot workability of the alloy is adversely affected.

Hence, the P content is specified to lie between 0.01 wt % and 0.30 wt %. A preferred range for the P content is from 0.03 wt % to 0.10 wt %.

(4) Sn and Zn:

These elements dissolve in the Cu matrix to provide better strength and elasticity and they are also effective in preventing the coarsening of crystal grains. Besides these effects, Sn has a particular advantage of providing better heat resistance whereas Zn is effective in improving the ability to withstand the heat of solder without delamination.

If the addition of these elements is less than 0.03 wt % in total, the stated effects are not fully achieved; if the Sn content exceeds 0.50 wt %, there occurs a marked drop in thermal (and electrical) conductivity. Hence, the content of either Sn or Zn or both is specified to lie between 0.03 wt % and 0.50 wt %.

(5) Ag, Co, B, Mn, Cr, Si, Ti and Zr:

These elements either dissolve or precipitate in the Cu matrix to form compounds that can provide better strength and elasticity; they are also effective in preventing the coarsening of crystal grains. Besides these effects, B has a particular advantage of enhancing the deoxidation of the melt to reduce the number of dissolved oxygen atoms in the Cu matrix so that their interaction with dislocations that may occur during metal working is sufficiently suppressed to ensure better elongation. Manganese (Mn) is also capable of deoxidizing the melt and it has the added advantage of improving the ability to withstand the heat of solder without delamination. Aside from these characteristics, Cr, Si, Ti and Zr are also capable of providing better heat resistance.

If the addition of these elements is less than 0.05 wt % in total, the stated effects are not attained; if their addition exceeds 0.50 wt %, there occurs a marked drop in thermal (and electrical) conductivity and economic disadvantages will also occur as exemplified by the need to employ unduly high annealing temperatures in the manufacturing process.

Hence, the content of at least one element of the group consisting of Ag, Co, B, Mn, Cr, Si, Ti and Zr is specified to lie between 0.05 wt % and 0.50 wt %.

(6) $O_2$:

If $O_2$ is present in unduly large amounts, Fe and P will form oxides that can potentially deteriorate the reliability in plating and other characteristics of the copper-base alloy of the invention; hence, the content of $O_2$ is preferably limited not to exceed 30 ppm.

Working and Heat Treatments:

The working and heat treatments to be performed in the manufacture of the copper-base alloys of the invention start with an ingot having the stated composition to a temperature of 800–950° C. and hot working it by a reduction ratio of 50% or more, then quenching the hot worked material from 600° C. or above down to 300° C. or below at a cooling rate of at least 1° C./sec.

Among these steps, the one of heating the ingot to a temperature of 800–950° C. is indispensable for the purpose of eliminating the microscopic and macroscopic segregation of solute elements in the ingot, thereby insuring a homogeneous distribution of the solutes. If the heating temperature is less than 800° C., the distribution of the solute elements is not sufficiently homogenized to prevent cracking during the subsequent hot working. If the heating temperature exceeds 950° C., Sn and other elements of addition will diffuse to the surface of the ingot to form oxides, which contribute not only to the occurrence of cracking during the subsequent hot working but also to economic disadvantages. Hence, the hot working should start at 800–950° C.

The step of hot working by a reduction ratio of 50% or more is indispensable for providing uniform and fine crystal grains. If the reduction ratio is less than 50%, coarse crystal grains will form to deteriorate the amenability of the final product to bending work. Hence, the reduction ratio to be achieved by the hot working should be at least 50%.

The hot worked material is then quenched from 600° C. or above down to 300° C. or below at a cooling rate of at least 1° C./sec. This step is indispensable for bringing the Cu matrix to a supersaturated solid solution such that uniform and fine grains of an Fe—Ni—P system intermetallic compound will be precipitated by the subsequent heat treatments. If the quenching is started below 600° C. or if the cooling rate is less than 1° C./sec, the Cu matrix cannot be brought to a fully supersaturated solid solution. If the quenching ends in a temperature range higher than 300° C., coarse precipitates will form at the end point. Hence, the hot worked material should be quenched from 600° C. or above down to 300° C. or below at a cooling rate of at least 1° C./sec.

In the next step, the hot worked material is subjected to a heat treatment at a temperature of 380–520° C. for 60–600 min without performing cold working. This step is indispensable for insuring that an Fe—Ni—P system intermetallic compound is precipitated as uniform and fine grains not larger than 50 nm. if the temperature for this heat treatment is less than 380° C., the intended precipitation of the intermetallic compound will not fully occur; if the temperature exceeds 520° C., coarse precipitates will form. In either case, there cannot be achieved a balanced development of strength and electrical conductivity no matter how dexterous the subsequent working and hot treatments will be.

Even if the stated temperature requirement is satisfied, the intended precipitation of the intermetallic compound will not occur if the time of the heat treatment is less than 60 min. Even if the heat treatment is performed for a period longer than 600 min, no further precipitation of the intermetallic compound will occur and not only is it impossible to achieve commensurate improvements in the characteristics of the final product but economic disadvantages will also occur.

If the heat treatment of interest is performed after cold working, the temperature at which the Fe—Ni—P system intermetallic compound is precipitated in the Cu matrix as uniform and fine grains not larger than 50 nm competes with the recrystallization temperature of the compound and its crystal grains become nonuniform to deteriorate the amenability of the final product to bending work. Hence, the heat treatment subsequent to the hot working should be performed at a temperature of 380–520° C. for 60–600 min without cold working.

Subsequently, cold working and a heat treatment at a temperature of 450° C. or below are repeated as many times as are required to finish the work to a final size. This step is necessary to develop the characteristics desired for the final copper-base alloys and the cold working contributes particularly to the improvement of strength whereas the heat treatment contributes to that of electrical conductivity. If the temperature for the heat treatment of interest exceeds 450° C., the precipitates will become coarse and the Cu matrix will soften, causing a marked deterioration of strength. Hence, the temperature for this heat treatment is specified not to exceed 450° C. Each of the cold working and heat treatments need be performed only once in order to develop the intended characteristics but further improvements can be achieved by repeating these treatments several times.

As a result of the treatments stated above, one can produce materials in which fine grains of an Fe—Ni—P system intermetallic compound not larger than 50 nm are uniformly precipitated in the Cu matrix.

The following examples are provided for the purpose of further illustrating the present invention but are in no way to be taken as limiting.

EXAMPLE 1

Copper-base alloy Nos. 1–8 (invention alloys) and Nos. 9–15 (comparative alloys) that had the chemical compositions (wt %) shown in Table 1 were prepared in a high-frequency melting furnace and cast into ingots each measuring 40×40×150 (mm). The atmosphere during the melting and casting operations was sealed with Ar gas. A sample measuring 40×40×30 (mm) was cut out of each ingot at a site one third of its thickness as measured from the bottom. The samples were heated to 850° C. and hot rolled from the thickness of 30 mm to 10 mm by a reduction ratio of 67% and thereafter quenched with water and pickled. The cooling rate for the quenching (from 600 to 300° C.) was well in excess of 1° C./sec.

having a satisfactory surface in the central ridge were rated ○, those in which wrinkles occurred were rated Δ, and those in which cracks occurred were rated X. The results are collectively shown in Table 1.

As one can see from Table 1, copper-base alloy Nos. 1–8 within the scope of the invention had a good balance between hardness, tensile strength and electrical conductivity while exhibiting high amenability to bending work. Therefore, those alloys have very good characteristics which make them suitable for use as materials to make electric and electronic components such as leadframes.

In contrast, alloy No. 9 which was substantially free of Fe, and alloy Nos. 10–12 which were substantially free of Ni were not satisfactory in hardness or strength although they had high electrical conductivity. Alloy No. 13 which was substantially free of P and alloy No. 14 which contained more Fe than specified by the invention were low in electrical conductivity although they had high hardness and strength levels. Alloy Nos. 12 and 14 were also deteriorated in amenability to bending work. Thus, none of the comparative alloys could be regarded to have satisfactory characteristics that made them suitable for use as materials to make electric and electronic components such as leadframes.

TABLE 1

| Alloy No. | | Fe | Ni | P | Others | Cu | Hardness (Hv) | Tensile strength (N/mm$^2$) | Electrical conductivity (% IACS) | Amenability to bending work |
|---|---|---|---|---|---|---|---|---|---|---|
| Invention | 1 | 0.121 | 0.146 | 0.052 | B: 0.042 Ti: 0.057 | bal. | 174 | 584 | 77.1 | ○ |
| | 2 | 0.154 | 0.152 | 0.043 | Sn: 0.082 Ag: 0.054 | bal. | 166 | 547 | 78.3 | ○ |
| | 3 | 0.202 | 0.159 | 0.060 | — | bal. | 167 | 557 | 76.3 | ○ |
| | 4 | 0.202 | 0.159 | 0.060 | Sn:0.069 | bal. | 168 | 559 | 76.0 | ○ |
| | 5 | 0.219 | 0.163 | 0.071 | Sn: 0.57 Zn: 0.042 | bal. | 171 | 576 | 74.7 | ○ |
| | 6 | 0.321 | 0.259 | 0.069 | Sn: 0.054 Si: 0.105 | bal. | 172 | 598 | 68.9 | ○ |
| | 7 | 0.321 | 0.259 | 0.093 | Cr: 0.054 Zr: 0.045 | bal. | 171 | 588 | 70.9 | ○ |
| | 8 | 0.389 | 0.377 | 0.102 | Co: 0.202 Mn: 0.032 | bal. | 173 | 607 | 69.6 | ○ |
| Comparison | 9 | — | 0.102 | 0.063 | Sn: 0.057 | bal. | 128 | 423 | 82.2 | ○ |
| | 10 | 0.102 | — | 0.033 | — | bal. | 149 | 490 | 86.5 | ○ |
| | 11 | 0.213 | — | 0.034 | — | bal. | 152 | 505 | 79.6 | ○ |
| | 12 | 0.203 | — | 0.130 | Zn: 0.401 Mg: 0.215 | bal. | 156 | 515 | 76.6 | Δ |
| | 13 | 0.197 | 0.164 | 0.010 | — | bal. | 161 | 530 | 55.3 | ○ |
| | 14 | 1.025 | — | 0.090 | Sn:0.107 Zn:1.122 | bal. | 175 | 608 | 53.7 | Δ |
| | 15 | 0.218 | 0.162 | 0.647 | — | bal. | cracked during hot rolling | | | |

The as-rolled sheets were annealed at 450° C. for 480 min, then water quenched and pickled. Subsequently, the thus heat treated sheets were cold rolled to a thickness of 2.5 mm, annealed at 400° C. for 480 min, water quenched and pickled.

The sheets were further cold rolled to a thickness of 0.25 mm, annealed at 300° C. for 30 min, water quenched and pickled.

The thus prepared samples were processed to prepare specimens suitable for the measurement of hardness, tensile strength, electrical conductivity and amenability to bending work. The first three factors were measured in accordance with JIS Z-2244, JIS Z-2241 and JIS H-0505, respectively. For evaluating the amenability to bending work, a 90° W bend test was conducted (CES M-0002-6; R=0.2; in both the rolling direction and a direction normal thereto); specimens It should also be noted that alloy No. 15 which contained more P than specified by the invention cracked during the hot rolling and could not be subjected to any further experimentation.

EXAMPLE 2

Copper-base alloy sample having the composition of alloy No. 4(see Table 1 in Example 1) were subjected to the working and heat treatment described below under A–O. The samples were then processed to prepare specimens, which were measured or evaluated for hardness, tensile strength, electrical conductivity and amenability to bending work as in Example 1. The results are collectively shown in Table 2.

TABLE 2

| Alloy No. | | Composition (wt %) | | | | | Hardness (Hv) | Tensile strength (N/mm$^2$) | Electrical conductivity (% IACS) | Amenability to bending work |
|---|---|---|---|---|---|---|---|---|---|---|
| | | Fe | Ni | P | Sn | Cu | | | | |
| Invention Process | A | 0.202 | 0.159 | 0.060 | 0.069 | bal. | 168 | 559 | 76.0 | ◯ |
| | B | 0.196 | 0.152 | 0.056 | 0.070 | bal. | 171 | 570 | 74.0 | ◯ |
| | C | 0.202 | 0.157 | 0.060 | 0.069 | bal. | 163 | 534 | 79.2 | ◯ |
| | D | 0.201 | 0.148 | 0.065 | 0.068 | bal. | 174 | 594 | 69.8 | ◯ |
| Comparison Process | E | 0.202 | 0.159 | 0.060 | 0.069 | bal. | 160 | 522 | 76.0 | X |
| | F | 0.202 | 0.154 | 0.060 | 0.069 | bal. | 156 | 517 | 78.7 | ◯ |
| | G | 0.208 | 0.150 | 0.064 | 0.070 | bal. | 146 | 492 | 52.3 | Δ |
| | H | 0.197 | 0.148 | 0.062 | 0.070 | bal. | 135 | 445 | 69.6 | ◯ |
| | I | 0.196 | 0.150 | 0.065 | 0.069 | bal. | 154 | 511 | 79.2 | ◯ |
| | J | 0.198 | 0.157 | 0.067 | 0.070 | bal. | 162 | 531 | 67.9 | ◯ |
| | K | 0.201 | 0.150 | 0.058 | 0.070 | bal. | 158 | 519 | 55.2 | Δ |
| | L | 0.207 | 0.154 | 0.065 | 0.068 | bal. | 149 | 491 | 79.3 | ◯ |
| | M | 0.202 | 0.150 | 0.064 | 0.068 | bal. | 162 | 558 | 72.9 | X |
| | N | 0.198 | 0.152 | 0.065 | 0.070 | bal. | 150 | 494 | 78.3 | Δ |
| | O | 0.207 | 0.149 | 0.066 | 0.070 | bal. | 147 | 482 | 78.9 | Δ |

Prior to the working and heat treatments A–O, copper-base alloys having specified chemical compositions (wt %) were prepared in a high-frequency melting furnace under an Ar gas atmosphere and cast into ingots each measuring 40×40×150 (mm); the ingots were then subjected to the respective working and heating treatments.

Process A: Same as in Example 1 (invention)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling rate for the quenching (from 600 to 300° C.) was well in excess of 1° C./sec.

The as-rolled sheet was annealed at 450° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process B: (invention)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling rate for the quenching (from 600 to 300° C.) was well in excess of 1° C./sec.

The as-rolled sheet was annealed at 430° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process C: (invention)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling rate for the quenching (from 600 to 300° C.) was well in excess of 1° C./sec.

The as-rolled sheet was annealed at 500° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process D: (invention)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling rate for the quenching (from 600 to 300° C.) was well in excess of 1° C./sec.

The as-rolled sheet was annealed at 400° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process E: (comparison; a case where the reduction ratio in the hot working step was less than 50%)

A sample measuring 40×40×15 (mm) was cut out of the ingot at a site one third of its thickness as measured from the bottom. The sample was heated to 850° C. and hot rolled from the thickness of 15 mm to 10 mm by a reduction ratio of 33% and thereafter quenched with water and pickled. The cooling rate for the quenching (from 600 to 300° C.) was well in excess of 1° C./sec.

The as-rolled sheet was annealed at 450° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process F: (comparison; a case where the hot working step was followed by cooling that was started below 600° C. and the rate of which was less than 1° C./sec.)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling was started at 450° C. and the average rate of cooling from 450° C. to 300° C. was 0.2° C./sec.

The as-rolled sheet was annealed at 450° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process G: (comparison; a case where there was no intermediate heat treatment following the hot working and quench step)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for the quenching (from 600 to 300° C.) was well in excess of 1° C./sec.

The as-rolled sheet was cold rolled to a thickness of 0.25 mm, annealed at 300° C. for 30 min, water quenched and pickled.

Process H: (comparison; a case where there was not intermediate heat treatment following the hot working and quench step)

A sample measuring 40×40×30 (mm) was cut out of the ingot at a site one third of its thickness as measured from the bottom. The sample was heated to 850° C. and hot rolled from the thickness of 30 mm to 10 mm and thereafter quenched with water and pickled. The cooling rate for quenching (from 600 to 400° C.) was well in excess of it/sec.

The as-rolled sheet was cold rolled to a thickness of 0.25 mm, annealed at 500° C. for 90 min, water quenched and pickled.

Process I: (comparison; a case where the temperature for the intermediate heat treatment was higher than 520° C.)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was annealed at 550° C. for 180 min, then water quenched and pickled.

Subsequently, the thus heat treated sheet was cold rolled to a thickness of 2.5 mm, annealed at 450° C. for 90 min, water quenched and pickled.

The sheet was further cold rolled to a thickness of 0.25 mm, annealed at 300° C. for 30 min, water quenched and pickled.

Process J: (comparison; a case where the time of the intermediate heat treatment was shorter than 60 min)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was annealed at 500° C. for 30 min, then water quenched and pickled.

Subsequently, the thus heat treated sheet was cold rolled to a thickness of 2.5 mm, annealed at 450° C. for 90 min, water quenched and pickled.

The sheet was further cold rolled to a thickness of 0.25 mm, annealed at 300° C. for 30 min, water quenched and pickled.

Process K: (comparison; a case where the temperature for the intermediate heat treatment was lower than 380° C.)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was annealed at 350° C. for 600 min, then water quenched and pickled.

Subsequently, the thus heat treated sheet was cold rolled to a thickness of 2.5 mm, annealed at 400° C. for 600 min, water quenched and pickled.

The sheet was further cold rolled to a thickness of 0.25 mm, annealed at 300° C. for 30 min, water quenched and pickled.

Process L: (comparison; a case where the temperature for the heat treatment subsequent to cold working was higher than 450° C.)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was annealed at 450° C. for 600 min, then water quenched and pickled.

Subsequently, the thus heat treated sheet was cold rolled to a thickness of 2.5 mm, annealed at 470° C. for 600 min, water quenched and pickled.

The sheet was further cold rolled to a thickness of 0.25 mm, annealed at 300° C. for 30 min, water quenched and pickled.

Process M: (comparison; a case without final annealing)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was annealed at 550° C. for 90 min, then water quenched and pickled.

Subsequently, the thus heat treated sheet was cold rolled to a thickness of 0.25 mm, degreased and pickled.

Process N: (comparison; a case where the hot working and quench step was followed by cold working before subsequent heat treatment)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was cold rolled to a thickness of 5.0 mm, annealed at 450° C. for 480 min, then water quenched and pickled.

Subsequently, the thus heat treated sheet was cold rolled to a thickness of 2.5 mm, annealed at 400° C. for 480 min, water quenched and pickled.

The sheet was further cold rolled to a thickness of 0.25 mm, annealed at 300° C. for 30 min, water quenched and pickled.

Process O: (comparison; a case where the hot working and quench step was followed by cold working before subsequent heat treatment)

A sample measuring 40×40×30 (mm) was cut out of the ingot at a site one third of its thickness as measured from the bottom. The sample was heated to 850° C. and hot rolled from the thickness of 30 mm to 10 mm by a reduction ratio of 67% and thereafter quenched with water and pickled. The cooling for quenching (from 600 to 300° C.) was well in excess of 1° C./sec.

The as-rolled sheet was cold rolled to a thickness of 2.5 mm, annealed at 450° C. for 480 min, then water quenched and pickled.

Subsequently, the thus heat treated sheet was cold rolled to a thickness of 1.0 mm, annealed at 400° C. for 480 min, water quenched and pickled.

The sheet was further cold rolled to a thickness of 0.25 mm, annealed at 300° C. for 30 min, water quenched and pickled.

The results of the treatments by processes A–O are shown in Table 2, from which one can see that the alloys produced by processes A–D according to the invention had a good balance between hardness, tensile strength and electrical conductivity while exhibiting high amenability to bending work. Therefore, those alloys have very good characteristics which make them suitable for use as materials to make electrical and electronic components such as leadframes.

In contrast, the alloy produced by process E in which the reduction ratio in the hot working step was 33% and less than the claimed minimum level 50% and the alloys produced by processes G, H, J and K in which the conditions for the intermediate heat treatment subsequent to the hot working and quench step were outside the claimed ranges were deteriorated in each of three factors, i.e., hardness, strength and electrical conductivity. The alloy produced by process F in which the hot working step was followed by cooling that was started below the claimed 600° C. and the rate of which was less than the claimed 1° C./sec, the alloys produced by processes I, J, K and L in which the conditions for the intermediate heat treatment subsequent to the hot working and quench step were outside the claimed ranges, as well as the alloys produced by processes N and O in which the hot working and quench step was followed by cold working before subsequent heat treatment were deteriorated in at least one of three factors, i.e., hardness, strength and electrical conductivity and there was no improvement in characteristics that could compensate for the deterioration. The alloy produced by process E in which the reduction ratio in the hot working step was 33% and less than the claimed minimal level (50%) and the alloy produced by process M which involved no final annealing after the cold rolling to 0.25 mm were practically satisfactory in terms of hardness, strength and electrical conductivity but they were deteriorated in amenability to bending work and cracks occurred in the bent portions. The alloys produced by processes G, K, N and O were also deteriorated in amenability to bending work. Thus, none of the alloys produced by processes E–O could be regarded to have satisfactory characteristics that made them suitable or use as materials to make electric and electronic components such as leadframes.

EXAMPLE 3

Alloy No. 4 of the invention (treated by process A) having the composition shown in Table 1 in Example 1, as well as commercial iron-containing copper-base alloy (C19400 of grade EH: 2.35wt % Fe, 0.03 wt % P and the balance Cu) were tested or evaluated for hardness, tensile strength, electrical conductivity, amenability to bending work, heat resistance, the weathering of solder and the adhesion to plate. The results are shown in Table 3.

TABLE 3

| | Test alloy | |
| --- | --- | --- |
| | Invention alloy No. 3 | C19400 EH |
| Hardness (Hv) | 168 | 150 |
| Tensile strength (N/mm$^2$) | 559 | 510 |
| Electrical conductivity (% IACS) | 76.0 | 65.0 |
| Heat-resisting temperature (° C.) | 450 | 350 |
| Amenability to bending work | ○ | Δ |
| Weathering of solder | ○ | X |
| Adhesion to plate | ○ | ○ |

Hardness, tensile strength, electrical conductivity and amenability to bending work were measured or evaluated by the same methods as in Example 1.

Heat resistance was evaluated by measuring the temperature at which the hardness of a given sample dropped to 80% of the initial value (upon holding at that temperature for 30 min).

To evaluate the weathering of solder, a given specimen as plated with molten solder (by dipping in Sn-40% Pb at 260° C.×2 sec with the aid of a weakly active rosin flux) and held in a thermostatic bath at 150° C. for 1,000 h; thereafter, the specimen was subjected to a 90° W bend test and the bent portions were examined; the specimen was rated O when the solder plate adhered firmly and rated X when the solder plate delaminated.

For testing the adhesion to plate, a specimen was plated with Ag in a thickness of 3 $\mu$m and held at 500° C. for 10 min; the specimen was rated X when it was found to have surface blisters upon visual inspection and rated O when it had no such blisters.

As one can see from the data in Table 3, the copper-base alloy of the invention was markedly improved in terms of hardness, tensile strength, electrical conductivity, amenability to bending work, heat resistance and the weathering of solder as compared with the low-iron copper-base alloy which is representative of the materials conventionally used to make electric and electronic components such as leadframes. It is therefore obvious that the copper-base alloy of the invention is an excellent material to make electric and electronic components such as leadframes in comparison to the heretofore used low-iron copper-base alloy.

As will be understood from the foregoing description taken in conjunction with the examples, the copper-base alloys produced by the process of the invention have high strength, elasticity and thermal (and electrical) conductivities and, in addition, they are superior in workability, heat resistance and the ability to withstand the heat of solder without delamination. Hence, the alloys are applicable to various uses and it should particularly be noted that the invention provides high-strength, high-electroconductivity copper-base alloys that are suitable for use as materials to make electric and electronic components such as leadframes.

What is claimed is:

1. In a leadframe comprising a single frame structure for supporting leads on IC chips, the improvement wherein the leadframe is made of a high-strength, high-electroconductivity copper alloy, the copper alloy being made by a process which comprises preparing an ingot of a copper alloy consisting essentially of 0.05–0.40 wt. % Fe, 005–040 wt. % Ni, 0.01–0.30 wt. % P and the balance being Cu and incidental impurities, heating the ingot to a temperature of 800 to 950° C. and hot working the ingot to a reduction ratio of 50% or more, quenching the resultant hot worked material at a temperature from 600° C. or above down to a temperature of 300° C. or below at a cooling rate of at least 1° C./second, heat treating the resultant quenched material at a temperature of 380 to 520° C. for 60–600 minutes without performing cold working, and subsequently performing cold working and a heat treatment at a temperature of 450° C. or below, said high-strength, high-electroconductivity copper alloy having contained therein an Fe—Ni—P system intermetallic compound which is precipitated in a Cu matrix as uniform and fine grains not larger than 50 nanometers, said high-strength, high-electroconductivity copper alloy having a Vicker's hardness (Hv) of 163 or more, a tensile strength of 534 N/mm$^2$ or more, an electrical conductivity of 69.8% IACS or more and a superior amenability to bending work.

2. In a leadframe comprising a single frame structure for supporting leads on IC chips, the improvement wherein the leadframe is made of a high-strength, high-electroconductivity copper alloy, the copper alloy being made by a process that comprises preparing an ingot of a copper alloy consisting essentially of 0.05–0.40 wt. % Fe, 0.05–0.40 wt. % Ni, 0.01–0.30 wt. % P, a total of 0.03–0.50 wt. % of at least one metal selected from the group consisting of Sn and Zn, and the balance being Cu and incidental impurities, heating the ingot to a temperature of 800 to 950° C. and hot working the ingot to a reduction ratio of 50% or more, quenching the resultant hot worked material at a temperature from 600° C. or above down to a temperature of 300° C. or below at a cooling rate of at least 1° C./second, heat treating the resultant quenched material at a temperature of 380 to 520° C. for 60–600 minutes without performing cold working, and subsequently performing cold working and a heat treatment at a temperature of 450° C. or below, said high-strength, high-electroconductivity copper alloy having contained therein an Fe—Ni—P system intermetallic compound which is precipitated in a Cu matrix as uniform and fine grains not larger than 50 nanometers, said high-strength, high-electroconductivity copper alloy having a Vicker's hardness (Hv) of 163 or more, a tensile strength of 534 N/mm$^2$ or more, an electrical conductivity of 69.8% IACS or more and a superior amenability to bending work.

3. In a leadframe comprising a single frame structure for supporting leads on IC chips, the improvement wherein the leadframe is made of a high-strength, high-electroconductivity copper alloy consisting essentially of 0.05–0.40 wt. % Fe, 0.05–0.40 wt. % Ni, 0.01–0.30 wt. % P, a total of 0.03–0.50 wt. % of at least one metal selected from the group consisting of Sn and Zn and a total of 0.05–0.50 wt. % of at least one element selected from the group consisting of Ag, Co, B, Mn, Cr, Si, Ti and Zr, with the balance being Cu and incidental impurities, heating the ingot to a temperature of 800 to 950° C. and hot working the ingot to a reduction ratio of 50% or more, quenching the resultant hot worked material from a temperature of 600° C. or above down to a temperature of 300° C. or below at a cooling rate of at least 1° C./second, heat treating the resultant quenched material at a temperature of 380 to 520° C. for 60–600 minutes without performing cold working, and subsequently performing cold working and a heat treatment at a temperature of 450° C. or below, said high-strength, high-electroconductivity copper alloy having contained therein an Fe—Ni—P system intermetallic compound which is precipitated in a Cu matrix as uniform and fine grains not larger than 50 nanometers, said high-strength, high-electroconductivity copper alloy having a Vicker's hardness (Hv) of 163 or more, a tensile strength of 534 N/mm$^2$ or more, an electrical conductivity of 69.8% IACS or more and a superior amenability to bending work.

4. In a leadframe comprising a single frame structure for supporting leads on IC chips, the improvement wherein the leadframe is made of a high-strength, high-electroconductivity copper alloy, the copper alloy being made by a process which comprises preparing an ingot of a copper alloy consisting essentially of 0.05–0.40 wt. % Fe, 0.05–0.40 wt. % Ni, 0.01–0.30 wt. % P and optionally a total of 0.03–0.50 wt. % of at least one metal selected from the group consisting of Sn and Zn and a total of 0.05–0.50 wt. % of at least one element selected from the group consisting of Ag, Co, B, Mn, Cr, Si, Ti and Zr, with the balance being Cu and incidental impurities, heating the ingot to a temperature of 800 to 950° C. and hot working the ingot to a reduction ratio of 50% or more, quenching the resultant hot worked material from a temperature of 600° C. or above down to a temperature of 300° C. or below at a cooling rate of at least 1° C./second, heat treating the quenched material at a temperature of 380 to 520° C. for 60–600 minutes without performing cold working, and subsequently performing cold working an a heat treatment at a temperature of 450° C. or below, whereby an Fe—Ni—P system intermetallic compound is precipitated in a Cu matrix as uniform and fine grains not larger than 50 nanometers, said high-strength, high-electroconductivity copper alloy having a Vicker's hardness (Hv) of 163 or more, a tensile strength of 534 N/mm$^2$ or more, an electrical conductivity of 69.8% IACS or more and a superior amenability to bending work.

5. In a leadframe comprising a single frame for supporting leads on IC chips, the improvement wherein the leadframe is made of a high-strength, high-electroconductivity copper alloy, the copper alloy being made by a process which comprises heating an ingot of a copper alloy consisting essentially of 0.1–0.3 wt. % Fe, 0.1–0.3 wt. % Ni, 0.03–0.1 wt. % P, and optionally (i) a total of 0.03–0.5 wt. % of at least one metal selected from the group consisting of Sn and Zn and (ii) a total of 0.05–0.5 wt. % of at least one element selected from the group consisting of Ag, Co, B, Mn, Cr, Si, Ti and Zr, with the balance being Cu and incidental impurities, to a temperature of 800 to 950° C. and hot working to a reduction ratio of 50% or more to form a reduced thickness ingot, quenching the resultant hot worked reduced thickness ingot from a temperature of 600° C. or above down to a temperature of 300° C. or below at a cooling rate of at least 1° C./second, heat treating the resultant quenched reduced thickness ingot at a temperature of 380 to 520° C. for 60–600 minutes without performing cold working, and subsequently performing cold working and a heat treatment at a temperature of 450° C. or below, whereby an Fe—Ni—P system intermetallic compound is precipitated in a Cu matrix as uniform and fine grains not lager than 50 nanometers, said high-strength, high-electroconductivity copper alloy having a Vicker's hardness (Hv) of 163 or more, a tensile strength of 534 N/mm$^2$ or more, an electrical conductivity of 69.8% IACS or more and a superior amenability to bending work.

6. The leadframe of claim 5, wherein said copper alloy does not contain more than 30 ppm of oxygen.

7. The leadframe of claim 5, wherein said copper alloy consists essentially of 0.121 wt. % Fe, 0.146 wt. % Ni, 0.052 wt. % P, 0.042 wt. % B, 0.057 wt. % Ti and the balance being essentially Cu.

8. The leadframe of claim 5, wherein said copper alloy consists essentially of 0.154 wt. % Fe, 0.152 wt. % Ni, 0.043 wt. % P, 0.082 wt. % Sn, 0.054 wt. % Ag and the balance being essentially Cu.

9. The leadframe of claim 5, wherein said copper alloy consists essentially of 0.202 wt. % Fe, 0.159 wt. % Ni, 0.060 wt. % P and the balance being essentially Cu.

10. The leadframe of claim 5, wherein said copper alloy consists essentially of 0.202 wt. % Fe, 0.159 wt. % Ni, 0.060 wt. % P, 0.069 Sn and the balance being essentially Cu.

11. The leadframe of claim 5, wherein said copper alloy consists essentially of 0.219 wt. % Fe, 0.163 wt. % Ni, 0.071 wt. % P, 0.057 wt. % Sn, 0.042 wt. % Zn and the balance being essentially Cu.

12. The leadframe of claim 5, wherein said copper alloy consists essentially of 0.321 wt. % Fe, 0.259 wt. % Ni, 0.069 wt. % P, 0.054 wt. % Sn, 0.105 wt. % Si and the balance being essentially Cu.

13. The leadframe of claim 5, wherein said copper alloy consists essentially of 0.321 wt. % Fe, 0.259 wt. % Ni, 0.093 wt. % P, 0.054 wt. % Cr, 0.045 wt. % Zr and the balance being essentially Cu.

14. The leadframe of claim 5, wherein said copper alloy consists essentially of 0.389 wt. % Fe, 0.377 wt. % Ni, 0.102 wt. % P, 0.202 wt. % Co, 0.032 wt. % Mn and the balance being essentially Cu.

15. The leadframe of claim 5, wherein said copper alloy consists essentially of 0.202 wt. % Fe, 0.159 wt, % Ni, 0.60 wt. % P, 0.069 wt. % Sn and the balance being essentially copper.

16. The leadframe of claim 5, wherein said copper alloy consists essentially of 0.196 wt. % Fe, 0.152 wt, % Ni, 0.56 wt. % P, 0.070 wt. % Sn and the balance being essentially cu.

17. The leadframe of claim 5, wherein said copper alloy consists essentially of 0.202 wt. % Fe, 0.157 wt, % Ni, 0.60 wt. % P, 0.069 wt. % Sn and the balance being essentially cu.

18. The leadframe of claim 5, wherein said copper alloy consists essentially of 0.201 wt. % Fe, 0.148 wt, % Ni, 0.65 wt. % P, 0.068 wt. % Sn and the balance being essentially cu.

19. The leadframe of claim 5, wherein the Vicker's hardness is 163 to 174, the tensile strength is 534 to 607 N/mm$^2$ and the electrical conductivity is 69.8 to 78.3% IACS.

* * * * *